(12) United States Patent
Mathew et al.

(10) Patent No.: US 8,880,980 B1
(45) Date of Patent: Nov. 4, 2014

(54) SYSTEM AND METHOD FOR EXPEDITIOUS TRANSFER OF DATA FROM SOURCE TO DESTINATION IN ERROR CORRECTED MANNER

(71) Applicant: Cadence Design Systems, Inc., San Jose, CA (US)

(72) Inventors: Anish Mathew, Kerala (IN); Sandeep Brahmadathan, Karnataka, IN (US); Raveendra Pai G., Kerala (IN)

(73) Assignee: Cadence Design Systems, Inc., San Jose, CA (US)

( * ) Notice: Subject to any disclaimer, the term of this patent is extended or adjusted under 35 U.S.C. 154(b) by 116 days.

(21) Appl. No.: 13/686,612

(22) Filed: Nov. 27, 2012

(51) Int. Cl.
*G11C 29/00* (2006.01)
*H03M 13/05* (2006.01)
*H03M 13/15* (2006.01)

(52) U.S. Cl.
CPC .............. *H03M 13/05* (2013.01); *H03M 13/15* (2013.01)
USPC ............................ 714/764; 714/768; 714/784

(58) Field of Classification Search
CPC .......................... G06F 11/1076; G06F 11/1008
USPC ............ 714/764, 768, 785, 784, 781, 746, 47
See application file for complete search history.

(56) References Cited

U.S. PATENT DOCUMENTS

| | | | | |
|---|---|---|---|---|
| 4,799,215 A | * | 1/1989 | Suzuki | 370/227 |
| 5,790,776 A | * | 8/1998 | Sonnier et al. | 714/10 |
| 5,867,501 A | * | 2/1999 | Horst et al. | 370/474 |
| 7,049,473 B2 | * | 5/2006 | Mackewitz et al. | 568/454 |
| 8,443,263 B2 | * | 5/2013 | Selinger et al. | 714/768 |

\* cited by examiner

*Primary Examiner* — Fritz Alphonse
(74) *Attorney, Agent, or Firm* — Rosenberg, Klein & Lee

(57) ABSTRACT

A system and method for expeditious transfer of data from a source device to a destination device in error corrected manner are provided. The system and method avoid the substantial delay in utilizing an intermediate buffer, determining error, and remediating the detected errors before even initializing a transfer of an input data from the source device to the destination device. Upon completion of error correction, only those portions corrected are retransmitted to the destination memory rather than the complete corrected input data. A by-pass section is provided for copying input data to the destination memory with at least a degree of parallelism with the error detection of the input data delivered to a parallel buffer coupled with the correction section by a splitter section.

20 Claims, 11 Drawing Sheets

SYSTEM AND METHOD FOR EXPEDITIOUS TRANSFER OF DATA FROM SOURCE TO DESTINATION IN ERROR CORRECTED MANNER

The present invention is generally directed to providing expeditious transfer of data from a source to a destination in an error corrected manner. A system and method formed in accordance with certain embodiments of the present invention generally provide for expeditious delivery of usable data with a post-correction approach.

As the increasingly sophisticated needs of user require systems to become faster, more efficient, and smaller, circuit features take on nano-scale sizes, available system power is reduced, limits for physical dimensions and weight are decreased, and clock frequencies are increased. Consequently, the potential for data error and corruption in memory and/or in transit is greatly increased. Furthermore, with computing devices becoming more ubiquitous in enterprise, personal, and government spheres, more functions and use-cases are sought to be performed with less and less power. Physical chip sizes shrink, and corruption of data becomes much more likely due to a number of causes including quantum phenomena, such as charge migration, electron tunneling, cross coupling, and various parasitic and other transmission losses.

Conventional approaches to addressing such increasing sources of potential error include using very robust error correcting codes (ECC), redundant systems, larger die and feature size for transistors and the like. For example, in the Open Systems Interconnection (OSI) model, a plurality of layers, in some instances up to seven, are utilized each with a respective error detection and correction regime enacted therein. Such multiplicity and extreme redundancy of error correcting codes and features, however, introduces a large amount of processing overhead to a system which tends to slow the system down, and necessitate additional requirements for power and cooling, and the like. Another known approach to dealing with such rampant error rates, especially in mission critical or radiation encountering systems, is to utilize electromagnetic interference (EMI) shielded systems or radiation hardened (RadHard), with redundant backup systems numbering sometimes up to three or four separate autonomous processors with independent memory. The additional functional elements and resource stores yield significant inefficiencies.

In fact, a host of problems and inefficiencies are introduced when utilizing these known approaches for dealing with the increasing sources of error. One particularly acute problem is that the more robust the error correcting code (ECC) or its error mitigation regime, the more data space, processing time, power, and cooling requirements are introduced. For example, a very robust error correcting code may introduce several orders of magnitude greater time in detecting and regenerating data when errors are detected in the protected data payload. Additionally, with the multiple independent layers (such as a data link layer, a transaction layer, an application layer, and the like, each having its own data detecting and correcting regime), overhead is greatly increased. Data transmission is also delayed at each layer and various parasitic effects may also be introduced. Such solutions are clearly less than ideal.

There is therefore a need for a system and method for expeditious transfer of data from a certain source to destination in error corrected manner.

SUMMARY OF THE INVENTION

It is an object of the present invention to provide a system and method for expeditious transfer of data from source to destination in error corrected manner. It is a further object to provide a pass-through section to deliver data without delay to a destination with post-correction executed thereon after the delivery has been initiated or concurrent with the delivery thereof to realize a degree of parallelism with the transfer of the data to the destination memory.

These and other objects are attained in the system and method for expeditious transfer of data from source to destination in error corrected manner.

The disclosed method for expeditious transfer of data from source to destination in error corrected manner includes establishing a destination memory and a transfer controller to receive input data for delivery to the destination memory. The input data has a predetermined verification feature associated therewith. The transfer controller is actuated to deliver the input data substantially as received to the destination memory. The transfer controller is actuated to monitor the input data for error in portions thereof based on the predetermined verification feature. The transfer controller generates a corrected portion for each portion of the input data detected to contain error. Each of the corrected portions is delivered to the destination memory to post-correct a corresponding portion of the input data previously delivered thereto.

A system for expeditious transfer of data from source to destination in error corrected manner includes a destination memory and a transfer controller coupled to the destination memory. The transfer controller receives input data from a source for delivery to the destination memory. The input data has a predetermined verification feature associated therewith. The transfer controller includes a pass through section directing the input data substantially as received to the destination memory. The transfer controller also includes a correcting section which is coupled to the pass-through section to monitor the input data for error in portions thereof based on the predetermined verification feature. The correcting section generates a corrected portion for each portion of the input data detected to contain error. Each of the corrected portions is delivered to the destination memory to post-correct a corresponding portion of the input data previously delivered thereto.

A method for expeditious transfer of data from source to destination in error corrected manner includes establishing a destination memory and an error controller to receive input data for regeneration of erroneous portions and delivery of corrected portions to the destination memory. A duplication section is established to deliver the input data substantially as received to the destination memory and to the error controller. The error controller is actuated to monitor the input data for erroneous portions, the error controller generating a corrected portion for each portion of the input data detected to contain error. Each corrected portion is delivered to the destination memory to post-correct a corresponding portion of the input data previously delivered thereto from the duplication section.

Additional aspects and details will be set forth in the Description which follows and, in part, will be apparent from the Description and Figures.

BRIEF DESCRIPTION OF THE DRAWINGS

FIG. 8A is another simplified flow diagram illustrating an exemplary embodiment of the present invention;

DETAILED DESCRIPTION OF THE PREFERRED EMBODIMENTS

The subject system and method provide for expeditious transfer of data from a source to a destination in an error corrected manner. Briefly, the system and method operate on input data that is received from a source for delivery to a destination. This input data will typically have a predetermined verification feature associated with it (for example, an error correcting code). The input data is initially in an indeterminate state as the error detection has not yet been performed on the data. The input data is copied from the source directly to be delivered to the destination, forgoing an intermediate buffer, while at the same time, an error detection and correction step is performed without delaying the initialization of the transfer of the data. The input data thereby arrives at the destination without being delayed by the buffer population step, error correction, or detection stages.

Figure 1A:
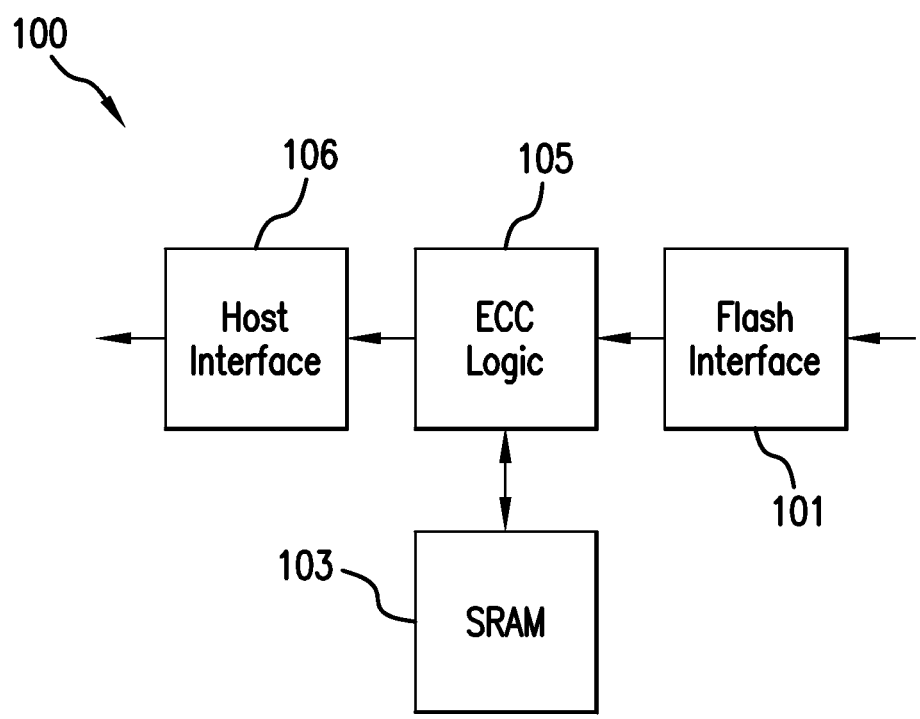
FIG. 1A is a simplified block diagram of a conventional system.

As seen in the illustrative block diagram of FIG. 1A, a system 100 for transfer of data with intermediate error correction (or pre-correction) in conventional manner is shown. A conventional configuration of components and interconnections therebetween for effecting transfer of data from a flash device 101 to a host interface 106 is shown. A batch of data retrieved from flash interface 101 is first stored into an SRAM buffer 103 of the ECC logic 105. Such transfer of the entire data batch into the SRAM buffer 103 from the flash interface 101 will take a certain amount of time (Time x) related to the size of data batch retrieved, the write speed of the SRAM, the read speed of the Flash, and the transmission speed therebetween. The ECC logic 105 does not provide for any further transfer to the host interface 106 until and unless: all of the data batch write to SRAM has completed (Time x), the entire data batch retrieved from the flash interface 101 has been evaluated for error therein (Time y), and any errors discovered are corrected (Time z) for a total delay of time equal to x+y+z.

Upon determination of an error therein, the ECC logic 105 regenerates the incorrect portions of the data retrieved from the flash interface 101 which may take a significant number, such as, for example, many hundreds to thousands of clock cycles to complete. It may be seen that time z is generally much greater than time x or y. Therefore, it is seen that no data reaches the host interface 106 in the interim; and, consequentially, no down-stream processing may be performed upon any portion of the data batch retrieved from flash interface 101 until the fully error-corrected data batch eventually arrives at the host interface 106. This would be after the entire batch of data has been fully pre-stored into a buffer, evaluated for error, and its corrupted portions pre-corrected at the ECC logic module 105. A practical problem with this is that the ECC regenerative processing takes an inordinately large amount of time ($z \gg x+y$), sometimes on the order of several hundred to several thousand clock cycles depending upon robustness of the ECC. Merely as an example, for data retrieved from flash interface 101 having a predetermined accuracy level such as 80% or 90%; the storage of data within the flash device 101 would be subject to a corresponding error rate of approximately 20% or 10% of the overall data. Then, although statistically 80% or 90% of the data (depending on the case) may have been correctly stored, that correctly stored data is not being utilized at all until all of the data has been verified or corrected as needed to be 100% accurate.

If, instead, in some more flexible or fault-tolerant use cases, the data were to be provided concurrently with the determination and remediation of error, then downstream processing at the host interface 106 would be able to commence much sooner. Some instances of fault-tolerant applications may include statistical processing where the likelihood of error in the source device 101 along with the likelihood of error in transmission therebetween may be statistically accounted for, such as, for example, with an increased margin of error. Additionally, applications which may be fault tolerant but latency intolerant, such as, for example, video streaming applications or voice over internet protocol (VOIP), would benefit greatly from the disclosed system and method for expeditious transfer in error corrected manner. Such applications may begin utilizing the data (the major portion of which is likely free of error) much sooner were it passed on immediately or at least without the substantial delay due to buffer data population, ECC detection, and correction delays at ECC logic 105.

Figure 1B:
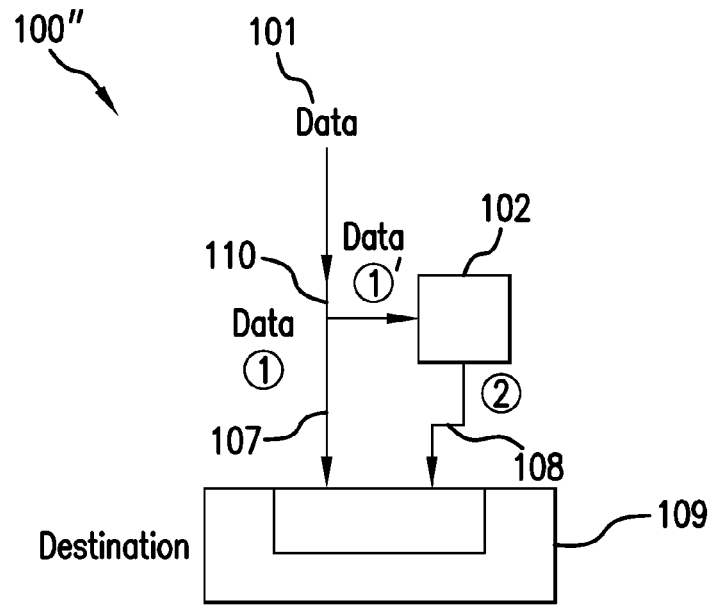
FIG. 1B is a simplified flow diagram illustrating an exemplary flow of data and instructions in an exemplary embodiment of the present invention.

One exemplary embodiment of a system and method formed in accordance with the present invention seeks to provide expeditious transfer of data from source to destination in error corrected manner. As illustrated in FIG. 1B, a flow 100" of such exemplary method for expeditious transfer of data from source to destination in error corrected manner is shown. Input data 101 is received from a source and is split at a data splitting or duplication section 110. Such source is implemented in the example shown as a flash device, but may be any suitable memory storage medium, data transmission medium, electro/optical system, or the like. Examples of particular implementations include: a redundant array of inexpensive disks (RAID), an array of solid state disks (SSDs), a network server, a fiber optic network interface, an Ethernet controller, a hard drive, a memory card, a universal serial bus (USB) memory, or the like.

The data splitting or duplication section 110 preferably includes a Y connector having one input and two or more outputs. In alternate embodiments, the data splitting or duplication section 100 may include a demultiplexer, a router, a switch, or the like. Input data 101 flows in at least two directions. Data flows in one direction into a pass-through section 107 which immediately transmits input data 101 to the destination 109. Such passing on of input data 101 to destination 109 occurs immediately, or at least without substantial delay. Concurrent with the delivery to the destination 109, input data flows in another direction to a transfer controller 102. The transfer controller 102 includes a correcting section which determines the presence of any error therein and then responsively seeks to correct such detected error. The correcting section may be implemented in a separate controller or as a dedicated error detecting and/or correcting portion incorporated into the transfer controller 102. Transfer controller 102 may itself be implemented in any suitable manner. For example, it may be incorporated into a source controller, a destination controller, an intermediate controller, a central processor, a network controller, a flash controller, a static random access memory (SRAM) controller, dynamic random access memory (DRAM) controller, or the like.

The determination of error is preferably made through comparison of a substantive payload data portion of input data 101 and a verification feature associated therewith. The associated verification feature employs, in a preferred embodiment, a Bose Ray-Chaudhuri Hocquenghem (BCH) Error Correcting Code (ECC); however, any suitable type of verification feature known in the art, such as a cyclic redundancy code (CRC), a parity data, a check sum, a hash, a secure digest, and the like may be utilized.

The transfer controller 102 and its correction section are preferably implemented with suitable hardware logic gates. This may be, for example, in an application specific integrated circuit (ASIC), a field programmable gate array (FPGA) with a stored instruction set, such as a ROM, firmware, or the like. The transfer controller 102 executes to compare data portions of input data 101 with a corresponding associated verification feature. Any suitable error correcting scheme known in the art may be utilized therein, such as, for example, the BCH ECC codes. BCH codes provide a class of error-correcting codes that allow for a selective pre-allocated level of robustness and resiliency depending upon the anticipated rate of error. Depending on such factors as the source of input data, such as a flash device, an SRAM buffer, or a faulty/lossy medium or transmission source, an appropriate level of robustness may be selectively employed by preselecting an amount of BCH encoding to correct the expected errors in the data portion. For example, in a relatively error-laden media such as a flash memory, a 16 byte BCH ECC code may be employed for each 512-bytes or 1024 bytes of substantive payload data transmitted as input data 101.

The correction section utilizes at least one buffer memory, such as, for example, an SRAM buffer, which is preferably embedded within the transfer controller 102. The memory may alternatively be embedded within the correcting section, or may be disposed separately therefrom. In certain embodiments, the source of input data 101, destination 109, transfer controller 102, and correcting section would each include some arrangement of buffer memory therein. Buffer memories may additionally be disposed intermediately between each of the source of input data 101, destination 109, and transfer controller 102.

Once a copy of the input data has been delivered into the data buffer, the correction section of transfer controller 102 performs a function symmetric to the function used to generate the verification feature for subsequent comparison between the product of the symmetric verification function with the original checksum or verification feature thereof. For example, the correcting section of transfer controller 102 may receive the copy of input data 101 into the data buffer and perform the same or a similar hashing, digesting, or error correcting code function upon the received input data 101 and compare the original verification feature with the newly generated verification feature. Alternatively, in some embodiments, depending upon the verification feature, the correcting section 102 may utilize a function complementary to the original generation function on the verification feature to arrive at a regenerated copy of the input data 101 for comparison with the original input data 101. Upon determination of an error through any means known to one of skill in the art, the correcting section of transfer controller 102 may then enact an error correction or remediation process to thereby correct errors detected in the input data 101. Each portion of the input data 101 detected to contain an error is regenerated to form delta or corrected portions. The correcting section or ECC engine, after completion of BCH regeneration, may generate correction information in a delta form. The ECC engine generates offsets plus information on which bits in the detected erroneous input data to flip. Data is read from the local SRAM buffer and correction information is applied thereto and then transmitted to the destination memory.

As the expected error rate of the input data 101 may be relatively low, such as, for example, on the order of 10% to 20%, (merely as example), the delta portions or corrected portions are transmitted incrementally rather than requiring a full transmission of the original input data 101 in its entirety to the destination memory 109. It is seen that at the time that the corrected portions are to be transmitted at transmission 108, that the input data 101 has likely already been fully delivered to destination 109. If, however, no data errors were detected, then no further data transmission would need to be performed as input data 101 has already been fully delivered to destination 109. If, however, the error detection determined only one or a few errors, then this determination and correction of error may happen midstream, during the initial undelayed delivery 107 to the destination 109. In such case, the delta or corrected portions may be transmitted directly to the destination 109. Destination 109 is a DRAM, but may be any destination device, storage or transmission medium, or the like, such as, for example, a host device, a hard drive, a RAID array, a USB flash drive, a memory card, or the like.

Figure 1C:
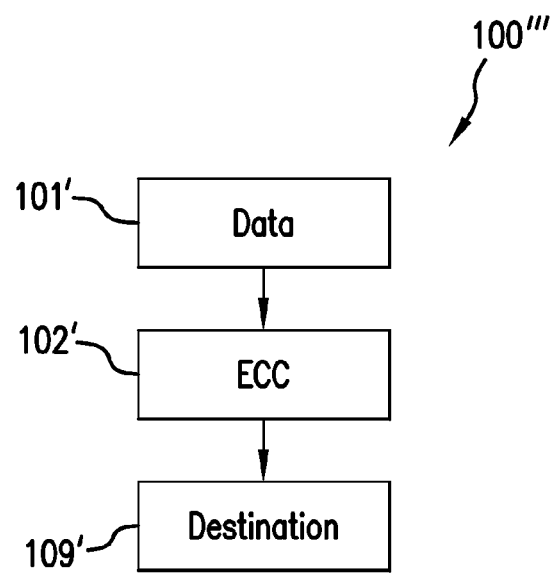
FIG. 1C illustrates a conventional flow of data and instructions.

In contradistinction to the flow for expeditious transfer of data as illustrated in FIG. 1B, a conventional flow 100''' is shown in FIG. 1C. A data 101' is provided to an ECC detection and correction module 102'. The ECC detection and correction module 102' delays the data 101' from delivery to the destination 109' to instead be transferred into a buffer within the ECC module 102'. After completion of transfer into the buffer, such questionable data 101' is quarantined or sequestered therewithin until ECC module 102' has completed both a detection and an error correction of any detected errors therein. Thereby, potentially unreliable or error-containing data 101' is quarantined from the rest of the system to prevent cascading failure or propagation of downstream processing errors. Once the ECC module 102' has completed the error detection and correction procedures, the corrected data 101' must be transferred in toto to the destination 109'. It is seen that the data 101' is substantially delayed in transit by an ECC controller 102' before reaching the destination member 109'. With such delay comes a cascading plurality of delays propagating throughout the system in a downstream manner and also in an upstream manner as additional data may not be recovered from the source until the finite amount of buffer space in the ECC module 102' has been flushed by way of eventual transfer to the destination 109'.

Figure 2:
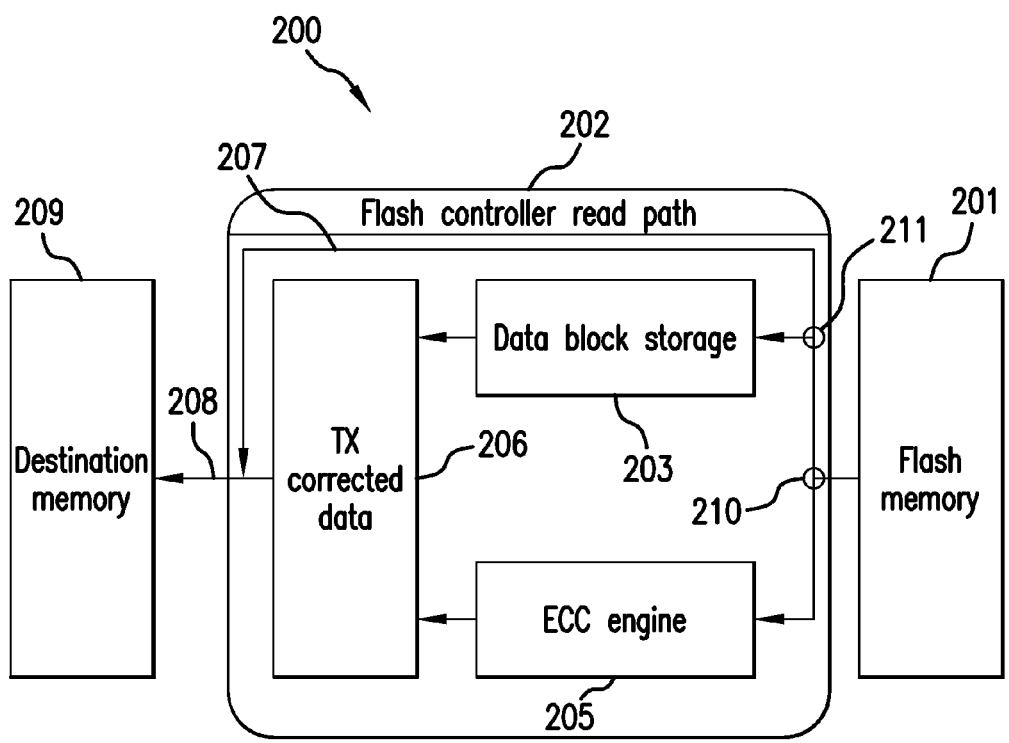
FIG. 2 is a simplified block diagram illustrating an exemplary interconnection of components in an exemplary system for implementing an exemplary embodiment of the present invention.

As seen in FIG. 2, an exemplary system 200 includes a flash memory 201 coupled to a flash controller 202. The connection with flash memory 201 is forked, branched, or split, such as, for example, with a Y-connector, at a splitting portion 210 and again at a second splitting portion 211. Thereby data from the flash memory 201 passes to a by-pass section 207 which proceeds via line 208 to a destination memory 209 while at the same time passing to a data block storage buffer 203. Concurrently, input data from the flash memory 201 passes to an ECC engine 205 to detect and correct errors in the input data. ECC engine 205 regenerates error portions with correction portions. Only once the data block storage 203 has been filled and the ECC engine 205 has completed detection and correction and replacement into the data block storage portion 203, are the corrected portions send to the destination memory 209.

Figure 4:
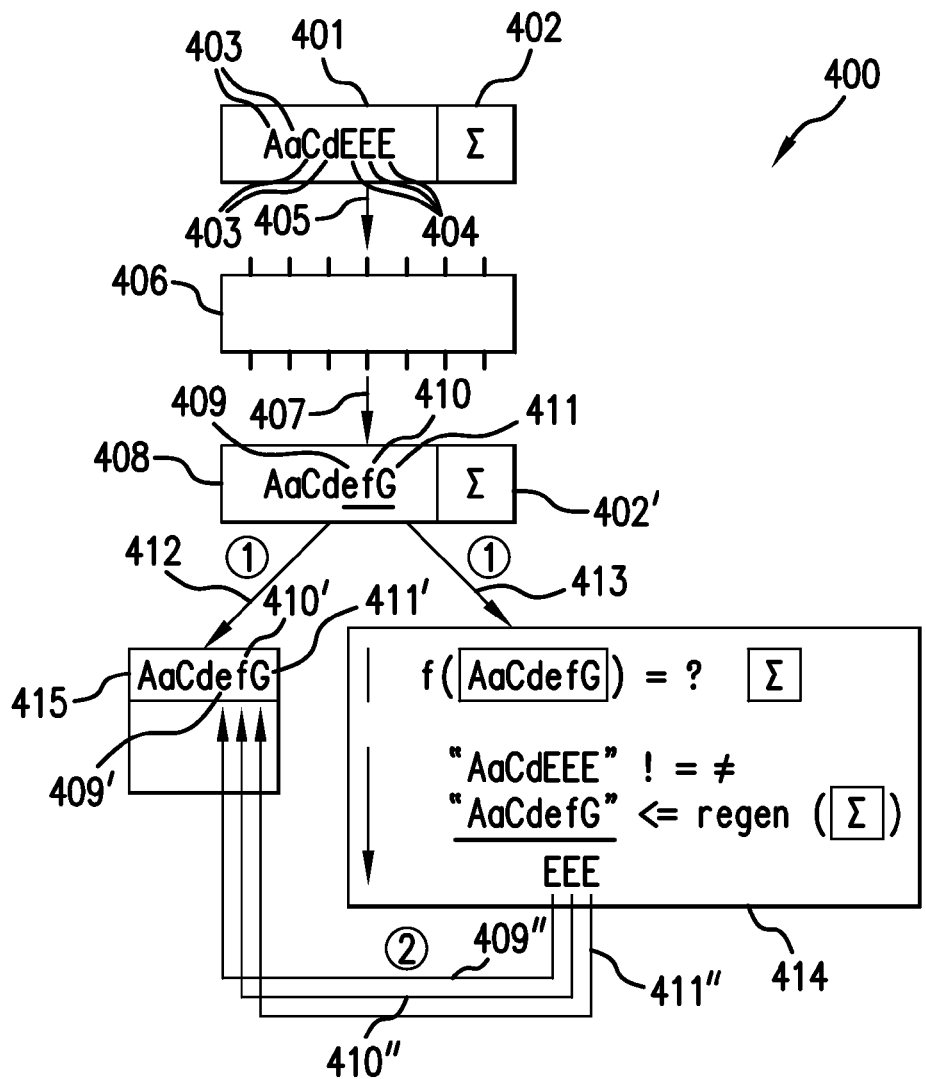
FIG. 4 is a more detailed flow diagram illustrating an exemplary configuration of the present invention and data and instructions flowing therethrough.

As seen in FIG. 4, flow 400 illustrates an exemplary process in accordance with an exemplary embodiment of the present invention. Input data 401 includes, for example, a plurality of characters, symbols, segments, or portions. In this example, a string of ANSI characters is shown; however, the substantive payload data generally comprises a plurality of 0 and 1 bits symbols which may represent any type of data objects. The ANSI string is shown here merely for simplicity and brevity. A first plurality of ANSI characters "AaCd" 403 is shown concatenated with three "E" symbols "EEE" 404. Additionally, verification feature 402, which is a checksum or ECC, is supplied as well. In a preferred embodiment, the verification feature is a BCH ECC code which maintains an error correction capability over the substantive payload data 401, in this instance "AaCdEEE."

The data 401 and verification feature 402 are pre-established 405 in a source, such as, for example, flash memory 406. Upon retrieval 407 from the flash memory 406, the data 401 is statistically likely to have a plurality of errors therein. Such errors may be due to a combination of reduced transistor feature size of the buffer, an increased clock rate thereof, and/or inherent weaknesses with static ram (SRAM) memory used in implementing a data buffer, thereby culminating in a charge migration which flips or corrupts bits stored therein, or other such error-inducing causes.

As an example of an error in the retrieved data 408, the last three characters "EEE" have become corrupt and are now represented by corrupted symbols "efg" 409, 410, and 411, respectively which may have resulted at the most atomic level from erroneous flipping of bits in data 401. The verification feature 402' has also been retrieved from the unreliable flash memory 406. Two concurrent transmissions 412 and 413 may be concurrent or have some degree of parallelism. For example, a verification transmission 413 to an error correction segment 414 may be delayed to occur after a first byte, symbol, or portion of the data 401 has been transmitted at transmission 412 to a destination 415. Destination transmission 412 shows the incorrect data 408 being transmitted to the destination memory 415 substantially unchanged from its retrieval state 408. Thereby, the errors in elements 409-411 propagate through to the destination memory 415 as error portions 409', 410', and 411'. While the transmission 412 is occurring, a second transmission, verification transmission 413 to a correction section 414 is being performed as well. Destination transmission 412 is not delayed until after verification transmission 412 is complete, but is instead delivered without substantial delay to the destination 415.

Within the correction section 414, a function is performed upon the substantive payload data 401 of retrieved questionable data 408 to determine error therein. If the function performed upon the substantive payload data 408 matches or is in agreement with the verification feature 402', then a signal indicating the correctness is transmitted to the destination memory 415, a controller therein, or to a transfer controller established therefor. Such determination and signal should occur almost immediately after a loading operation for populating a buffer within the correction section 414 with the retrieved data 408.

In the event that the substantive payload data 408 does not agree with the verification feature 402', then a regeneration of the substantive data or at least the erroneous portion thereof is undertaken. Such regeneration may take a substantial period of time depending upon the number of erroneous portions thereof, the robustness of the verification feature 402', and the processing power of the correction section 414. Once the detected erroneous portions have been regenerated, those regenerated correct portions 409", 410", and 411" may then be transmitted as delta, correction portions, or incremental portions to the destination memory 415 where they will replace the erroneous segments 409, 410, and 411, respectively.

Figure 5:
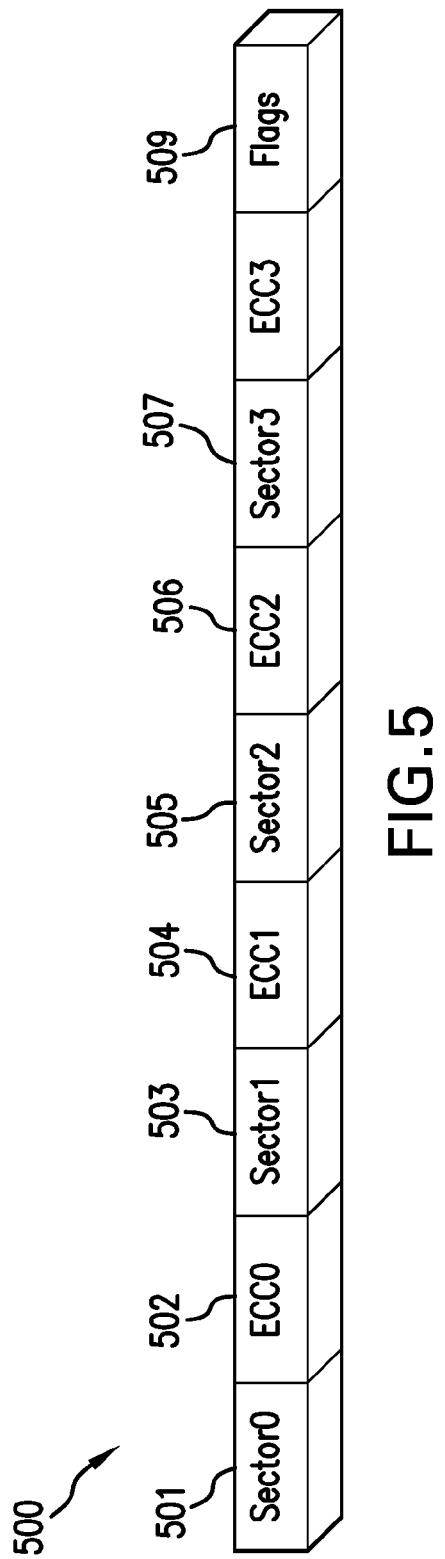
FIG. 5 is an exemplary block of data with interleaved verification portions and metadata flags to be operated upon in various embodiments of the present invention.

FIG. 5 shows an exemplary organization of pages of data in stripe ECC sets within a block often utilized in flash devices. Verification features 502, 504, 506, and/or 509, here shown as ECC check bits, are generally inserted every 512 to 1024 bytes of data to form an ECC block of information. However, the size of the substantive payload data, for example: 512/1024 bytes, may vary depending upon the reliability of the storage medium to be retrieved from, or the transmission medium to be received from. If a transmission or storage medium is generally less reliable, then more ECC bytes may be more frequently distributed, thereby interleaving them between smaller portions of substantive payload data. In a more reliable transmission or storage medium, less ECC check bytes may be used and would be less frequently distributed. Such ECC or verification feature information is generally striped in between 512-1024 bytes of data across a page. ECC information is read in the same pattern and the existence of errors are calculated for each 512-1024 bytes of data read. FIG. 5 shows a plurality of substantive payload data portions 501, 503, 505, and 507 interleaved with ECC verification feature portions 502, 504, and 506. The block arrangement 500 shows an exemplary 2 kilobyte page of the plurality of 512/1024 byte ECC data and ECC sectors therein. Generally, 16 bytes of BCH/ECC coding may be used for each 512 bytes of data stored in a flash memory storage medium. Additionally, a "flags" portion 509 may maintain a plurality of characteristics or parameters for each block or page of data.

Figure 3:
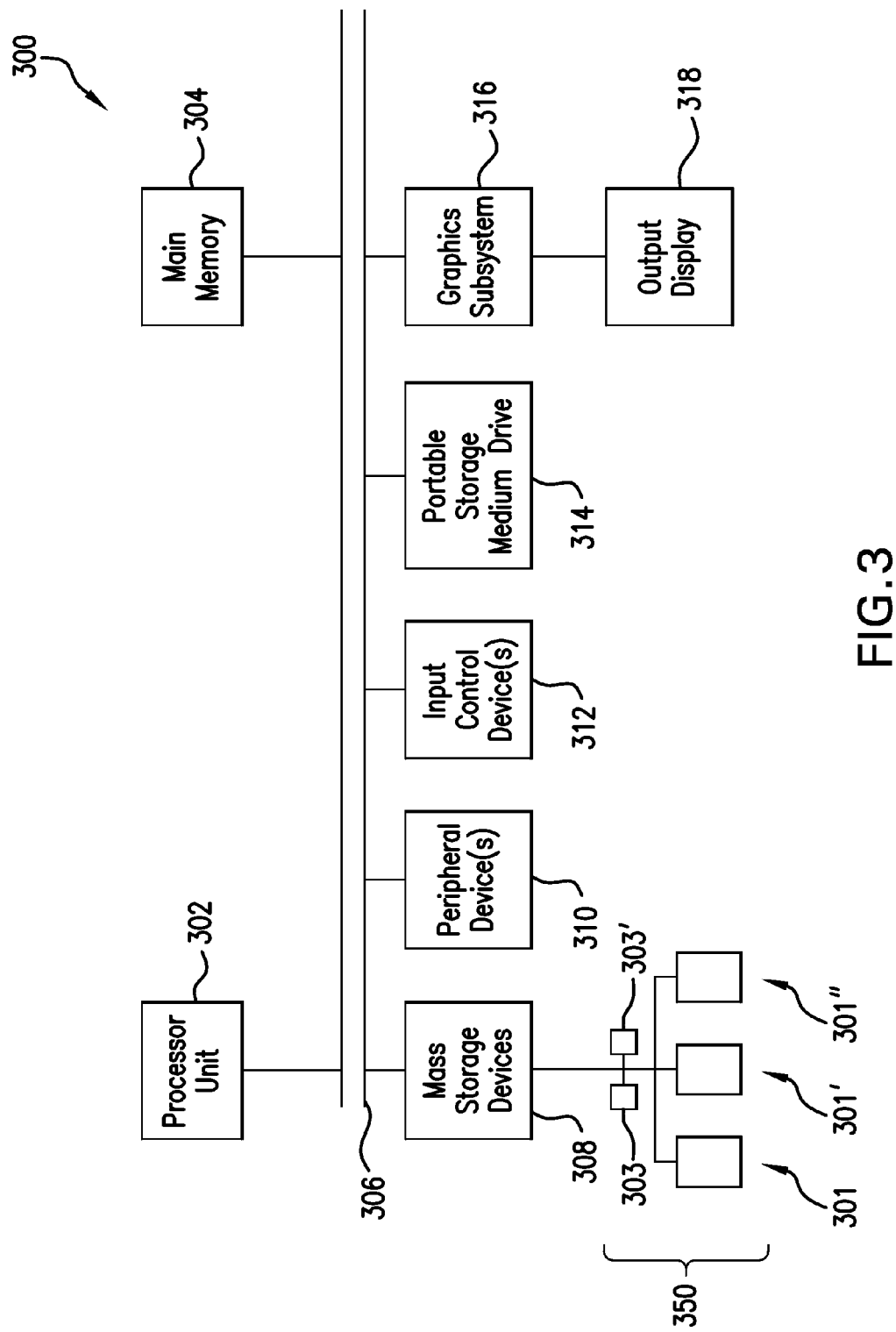
FIG. 3 is a simplified block diagram illustrating an exemplary interconnection of components in a processor-based system for implementing an exemplary embodiment of the present invention.

Turning to FIG. 3, an exemplary block diagram of a computer system employing an exemplary configuration of the disclosed system and method is illustrated. A computer system 300 contains a processor unit 302, a main or primary memory 304, an interconnect bus 306, a mass storage device 308, peripheral device(s) 310, input control device(s) 312, portable storage drive(s) 314, a graphics subsystem 316, and an output display 318, amongst other components. Processor unit 302 may include a single microprocessor or a plurality of microprocessors for configuring computer system 300 as a multi-processor system. Main memory 304 stores, in part, instructions and data to be executed by processor 302. Main memory 304 preferably includes banks of dynamic random access memory (DRAM) as well as high-speed cache memory, such as static random access memory (SRAM) at various levels of the system architecture.

For the purpose of simplicity, the components of computer system 300 are shown connected via interconnect bus 306. However, computer system 300 may be connected through one or more data transport means. Mass storage device 308, which may be implemented with a magnetic disk drive, an optical disk drive, a solid state device, an attachment to network storage, a RAID arraying any of the above, and the like, is preferably a non-volatile storage device for storing data, databases, and instructions, to be used by processor unit 302. In certain configurations, mass storage device 308 may store portions of the software to load it into main memory 304 or into a firmware or rom of one or both of a transfer controller 303 and/or a correction section 303'. It is seen that Mass storage device 308 is coupled to transfer controller 303 and an error correction section 303' (shown disposed external to transfer controller 303, however, this may be incorporated therein) which is/are coupled to a plurality 150 of storage devices 301, 301', and 301" variously serving as source and/or destinations for transfers thereamongst. Main memory 304 may also serve variously as a source and/or destination, as may a Graphics subsystem 316, Portable Storage Medium Drive 314, and the like.

Portable storage medium drive 314 operates in conjunction with a portable non-volatile storage medium such as a floppy disk, a compact disk read only memory (CD-ROM), or a digital versatile disk read only memory (DVD-ROM), to input and output data and code to and from the computer system 300. In one configuration, software portions are stored on such a portable medium, and are input to computer system 300 via portable storage medium drive 314. Peripheral device(s) 310 may include any type of computer support device such as an input/output (I/O) interface, to add additional functionality to computer system 300. For example, peripheral device(s) 310 may include additional network interface cards to interface computer system 300 to additional networks.

Input control device(s) 312 provide a portion of the user interface for a computer system 300 user. Input control device(s) 312 may include an alphanumeric keypad for inputting alphanumeric and other key information; and a cursor control device such as a mouse, a track pad or stylus; or cursor direction keys.

In order to display textual and graphical information, computer system 300 contains graphic subsystem 316 and output display(s) 318. Output display 318 may include a cathode ray tube (CRT) display, liquid crystal display (LCD), plasma display, projector, or the like. Graphic subsystem 316 receives textual and graphical information and processes the information for output to display 318.

In a software implementation, the portions of software for certain measures may include a plurality of computer executable instructions, to be implemented on a computer system. Prior to loading in the computer system or firmware, the software may reside as encoded information on a computer-readable tangible medium such as a magnetic floppy disk, a magnetic tape, CD-ROM, DVD-ROM, flash memory, or any other suitable computer readable medium. Such software may control multiplexors, selectors, field programmable gate arrays (FPGAs), or the like to implement logical control of transfer and error detection and correction features.

In an illustrative implementation, such a system may be implemented in any suitable computer based platform known in the art. For example, the system may comprise suitable storage media and one or more dedicated processors or share one or more processors executing/controlling other functions, wherein the employed processor(s) is programmably configured with processor instructions for performing the functions described herein. Suitable circuits may also be developed to execute certain aspects of these functions.

Figure 6:
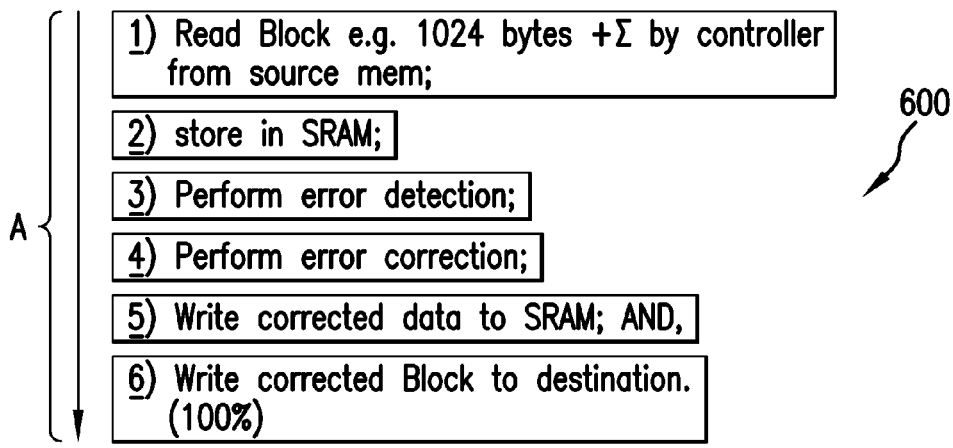
FIG. 6 is a simplified flow diagram illustrating a conventional approach.

As seen in FIG. 6, a conventional process 600 for transmitting data is disclosed. At step 1, a block of, for example 1024 bytes plus 16 bytes of verification or check sum data is read from a first memory by a controller thereof. Each 1024 plus 16 bytes×8 bits per byte (8320 bits) is then stored at step 2 into a temporary SRAM buffer which may take a number of clock ticks to store all 8320 bits of data. Each clock tick may generally transmit 4 bytes of data depending upon system configuration. In step 3, an error detection is performed upon the 1024 plus 16 bytes stored in the SRAM buffer in step 2. Responsive to an affirmative error detection, a substantially time consuming error correction process is initiated at step 4, whereby any detected errors in the buffer are regenerated based upon an operational comparison of the 1024 bytes of data and the ECC data. Only once the entirety of the 1024 plus 16 bytes of data are stored into the SRAM buffer, an error detection sequence is performed upon data in the SRAM buffer, and error portions have been corrected, is the corrected 1024 plus 16 bytes of data then finally written to a destination address at step 6. Only after a time A has elapsed, once the data is written to the destination after stage 6, is any portion of the data available for downstream processes.

Figure 6A:
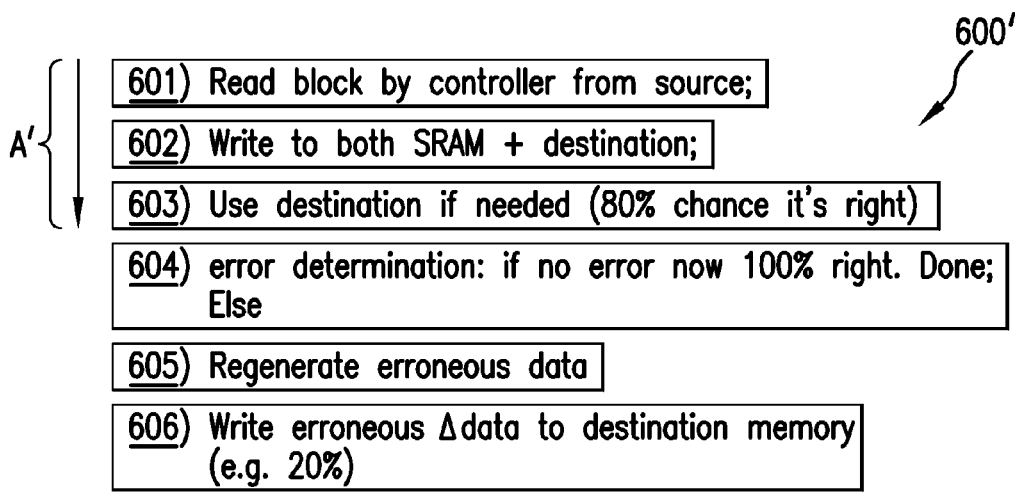
FIG. 6A is a simplified flow diagram illustrating an exemplary embodiment of the present invention.

In contradistinction, as seen in FIG. 6A, a flow 600' is provided where a block of data (for example, 1024 bytes plus 16 bytes of verification feature) are read from a source. At block 602, the 1024 plus 16 bytes are simultaneously written to the destination memory and to an SRAM buffer. While the term simultaneously or concurrently is used herein, this is only a preferred embodiment where, in the interests of brevity and clarity, "simultaneous" or "concurrent" have been used; however, some degree of parallelism is used whereby the write to the destination memory is not substantially delayed to be started until after an error detection and correction process has been performed. Rather, the data is written without substantial delay to the destination memory to have some overlapping period with the writing of the same data to an SRAM buffer, an error detection, and error correction performed thereupon. At block 603, at least several of the first portions of data have presumably completed transfer into the destination memory and are thereby available for downstream processing by a controller, a processor, and the like.

While this delivered data in the destination is not verified to be accurate, it may be accounted for or estimated based upon an either pre-known error rate of a storage or transmission medium, or may be responsive to one or a series of tests performed upon the storage or transmission medium from whence the data came. If the data transmission or storage medium is assumed to have an 80% reliability (this is provided merely for illustrative or exemplary purposes), then it may be assumed that the unverified portions of data stored within the destination memory are generally in line with the error rate of the transmission or storage medium they were received from. Additionally, the expected error rate may be adjusted based upon the summation of a likelihood of error in the storage or transmission medium, the intermediate buffer storage therebetween, and any transmission line loss rate expected between the destination memory, the pass-through portion, and the source.

In some applications, 100% reliable data is not necessary, but a 90%, 80%, or even 51% data accuracy may be acceptable depending upon the application. For example, with statistical or probabilistic processing, the likelihood of error in the data may be built into a framework and utilized in calculations therefor. In some applications, a certain amount of loss is perfectly acceptable, such as a video stream, voice over internet protocol VOIP, teleconferencing, and the like, where speed of delivery outweighs the need for strict accuracy of the data thereof. Generally, such use cases may be determined by their quality of service (QOS) requirements and latency tolerances specified therein. For example, a low latency-tolerant application may be a suitable application for such framework.

The subject system and method provide generally reliable data without delay with post correction of the data following delivery. Thereby, the best of both worlds are realized in that data is provided without delay and data is corrected shortly thereafter.

An error determination occurs at block 604: if no error was detected in the data that was expeditiously delivered without delay, it is now known to be correct and the flow 600' is complete. In other situations where an error was detected at block 604, a regeneration of the erroneous data is performed at block 605. Such regeneration may take a substantial period of time, but as the substantive data (having at an exemplary 80% accuracy) was already delivered at block 602 to the destination memory and downstream processing has been progressing without delay, such error regeneration is not time critical. The error regeneration may be performed without expedition.

At block 606, the erroneous delta or change data between the regenerated portion and the originally provided data to the destination memory is then transferred to the destination memory. It may be expected that an amount corresponding to the error rate will be transferred. For example, if the error rate in a transmission or storage medium is expected to be 20%, then it is likely that at block 606, 20% of the total data will need to be retransferred to the destination memory. This is in distinction to the processing in FIG. 6 as amongst other differences, only 20% of the data needs to be transmitted to the destination memory upon completion of error detection remediation, whereas in the conventional approach as seen in FIG. 6, 100% of the data needs to be transferred thereafter. Indeed, in FIG. 6, none of the data is available in the destination until after the error detection and remediation are completed in total and the data is thereafter delivered. Thereby, it is seen that a time A' delay until data in destination memory is known to be correct is much less than the time A in FIG. 6 until data is available (A'<<A).

Figure 7:
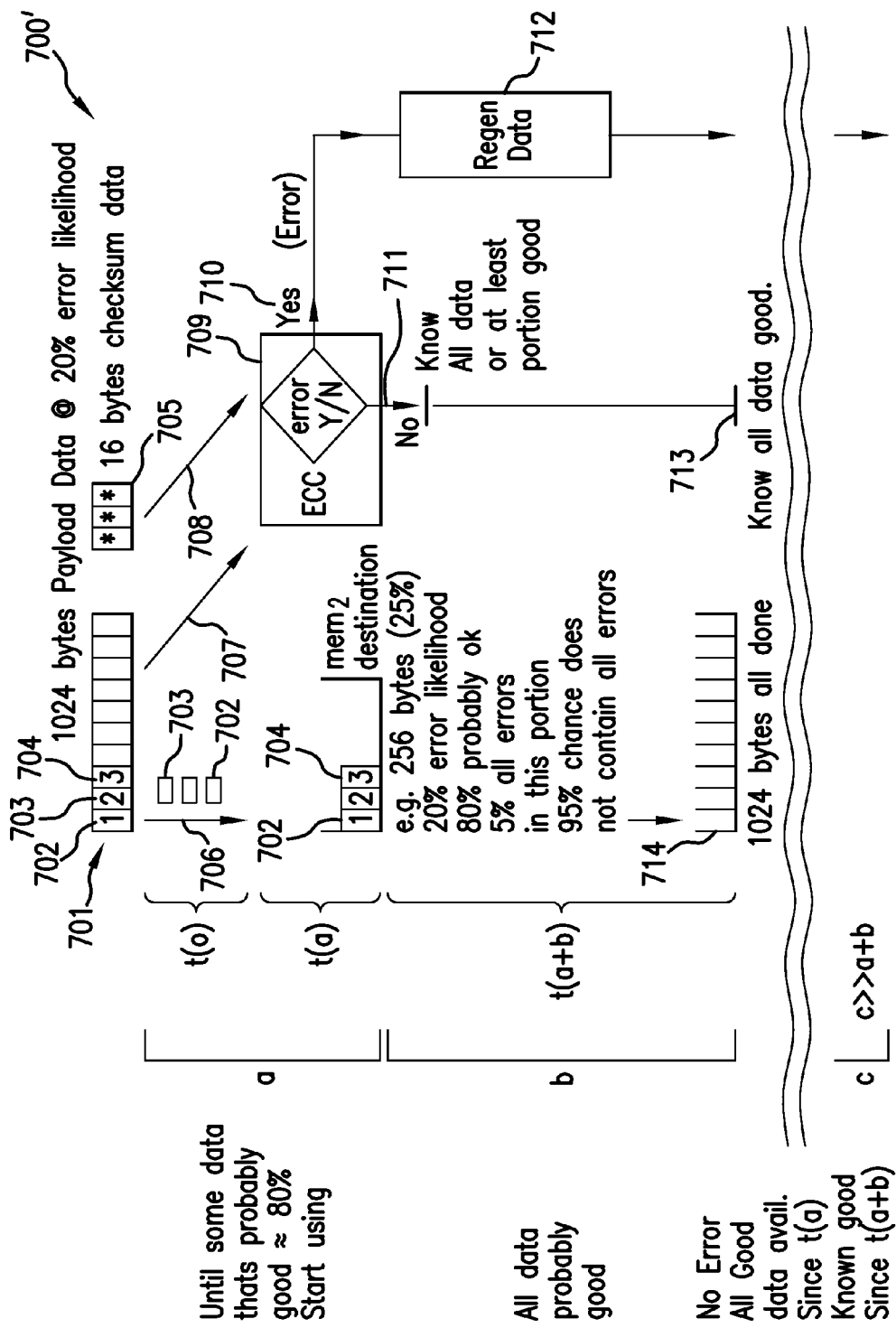
FIG. 7 is a yet further detailed exemplary flow diagram illustrating another exemplary embodiment of the present invention.

As seen in FIG. 7, a process 700 for expeditious transfer of data from source to destination in an error corrected manner is shown. An input data 701 is provided with a number of smaller portions 702, 703, and 704 thereof. The input data 701 may generally be, for example, 1024 bytes. A verification portion 705 may accompany the input data 701 or may merely be associated with it and transmitted in a side band or out of band (OOB) manner. In a preferred embodiment, the verification feature is a BCH ECC data concatenated with the input data 701. The verification feature 705 may comprise 16 bytes of check sum data for every 512 or 1024 bytes of input data 701. However, this relation of check sum data or BCH ECC data size relative to input data 701 size may vary according to the reliability of the transmission or storage medium from whence it came. Generally, the more reliable the transmission or storage medium, the less checksum data will be necessary. For example, in an ideal transmission or storage medium where the error rate approaches 0% likelihood of error, the check sum data may be almost entirely omitted. Where there may be some small chance of error, for example, somewhere between 1% and 20% likelihood of error, perhaps a 16 byte check sum error for every 512 or 1024 bytes of input data 701 may prove sufficient.

At time t(0), first portions of data 702, 703, and 704 are directly transmitted 705 from the input data 701 to a destination memory (MEM$_2$) concurrent with (or without substantial delay between transfer 705 and) transfers 707 and 708 of the same input data 701 and a check sum data 705 to a correcting section of a transfer controller 709. Transfer 707 and/or 708 may be executed substantially concurrent with the first transfer 705 or may be interleaved or slightly offset from the initial transfer 705. For example, transfer of three one byte portions 702-704 may be initiated and then the transfer 707 and 708 may be performed. Alternatively, all three transfers 705, 707, and 708 may be executed concurrently through the transfer controller, flash memory controller, and/or destination memory controller or a central processing unit (CPU).

Returning to the initial transfer 705, it is seen that at least a portion of the input data 701 is provided to a destination MEM$_2$ without substantial delay. It is seen that at time t(a) that the data portion 702, 703, and 704 are provided in the MEM$_2$ destination without delay. Such portion may, for example, be 256 bytes which is approximately 25% of the initial input data 701. It is seen that this initial portion of data 702-704 has a 20% likelihood of error, and thus is likely 80% accurate. Correspondingly, a 5% chance exists that all of the errors in the initial input data 701 are contained within this initial portion which results in a 95% chance that not all of the errors are contained within this initial portion 702-704. It is seen that at time t(a) that at least a first portion 702-704 being at least 80% likely accurate is provided in the destination memory MEM$_2$. This initial portion 702-704 may then be utilized by a downstream processor to extract usable data or perform calculations upon this data with an 80% reliability thereof. A log or data file may be utilized to record which downstream operations utilized the initial portions of data thereon such that a later error correction or verification signal may trigger the processor or controller to redo calculations that may have relied upon the data, if it was later determined that the data relied upon was inaccurate. Still further, if the initial data portions 702-704 were subsequently copied to another location, the log or data file may reflect this for correction once erroneous data has been regeneratively corrected.

Simultaneous with this processing or at least without substantial delay, transfers 707 and 708 have at least started transferring an input data 701 and a verification feature 705 to a transfer controller 709 which contains an error detecting and an error correcting portion. If transfer controller 709 determines that no error exists, then flow proceeds to the "no" direction 711 which may signal at time t(a) that no error exists in the input data 701 or at least a portion, such as, for example, portions 702-704. Thus, at time t(a), the portion 702-704 which already exists in the destination memory MEM$_2$ may be verified to be 100% correct. At this point, a log file recording the downstream utilizations of the portions 702-704 may be erased, re-performed, retransmitted, or may be verified as having been based upon correct data. If the error detection takes longer than an expected almost immediate signaling upon receipt of the input data 701 and verification portion 705 into the transfer controller 709 (which may be stored in an SRAM thereof), then the transfer controller 709 may signal the destination memory or the transfer controller at some intermediate point t(a+b). Incremental verification signals may be iteratively presented to the destination memory controller or transfer controller throughout the time period from t(a) to t(a+b).

At some time t(a+b), if no error exists, then a signal indicating such is sent indicating that all 1024 bytes of the input data 701 are verified and that no data error exists therein. At this point, it would be known that the entirety of the input data 701 is accurate and resides fully in destination MEM$_2$. Contrarily, if an error is detected by the transfer controller 709 in the input data 701 based upon a comparison or function based on the input data 701 and/or the verification portion 705, then a "yes" decision is reached and error exists. A signal 710 is sent which then begins a process of regenerating the input data 701 at block 712. The regeneration of the input data 701 may take quite a while which may proceed in a downward manner through the Fig. culminating with a correction of errors in the input data 701. Beneficially though, the downstream processes are not delayed as they received a start of data at time t(a), and a verification of that data at time t(a+b). Further, at the end of that t(a+b) period, the destination memory had received all 1024 bytes which had approximately 80% correctness and a signal has been sent indicating that either the data is 100% or that some error portion exists.

At time t(a+b), downstream processes relying upon that input data 701 can make informed decisions and process the data accordingly knowing that the input data 701 was either 80% correct or 100% correct. In the meantime, while such downstream processes are already utilizing the unknown or unverified input data 701 (perhaps for use-cases not requiring 100% accuracy, such as lossy applications or applications where minimization of latency is more important than accuracy of data, including video streaming, voice over IP, and the like) the data is concurrently being verified and corrected.

Additionally, programs which may utilize a rough estimation of data up front, and may catalogue uses of the data (such that when verification and correction of the data arrives), some portion of the down stream processing may already be done and may also take advantage of such system. Therefore, while the long, processor-intensive regeneration of data at block 512 is being performed, at least the useful data 714 exists for downstream processes to utilize to at least some degree allowing for at least some degree of parallelism and faster operation thereof.

At time (a+b+c) where (c) is much greater than a and b (c>>a+b), a fully regenerated data is returned to the destination memory $MEM_2$. Such transfer of the regenerated data does not need to be delivered in tow as the input data 701 already resides in destination $MEM_2$, but may instead merely be the Delta portions, erroneous portions, or portions which are seen to be different from the input portions 701. Thereby, one may statistically expect that at time (c), if there is a 20% error likelihood in input data 701, that merely 20% of the input data 701 needs to be regenerated and transferred as delta or correction portions to the destination $MEM_2$.

Figure 8:
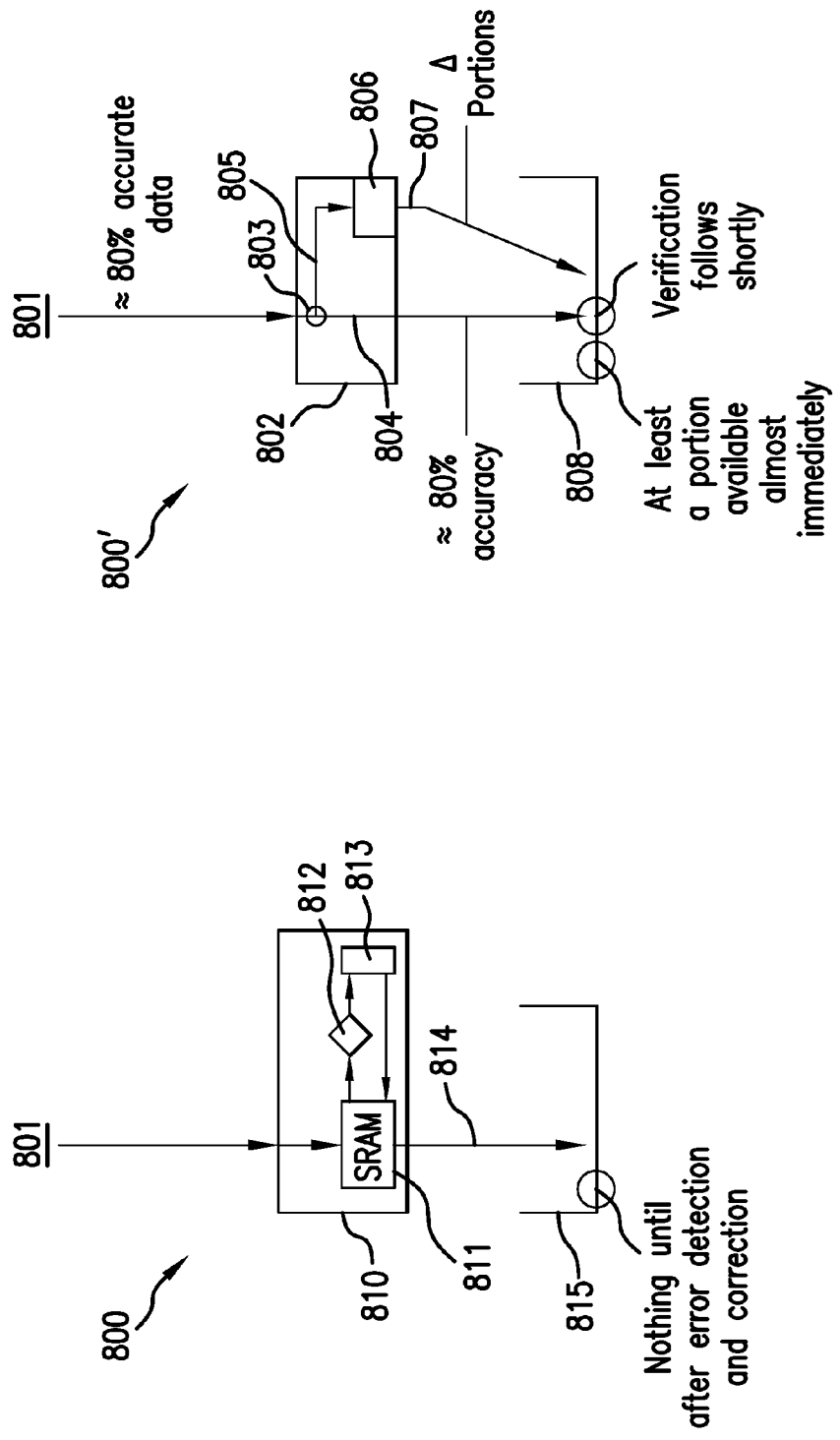
FIG. 8 is another simplified flow diagram illustrating a conventional approach of the present invention.

As seen in FIG. 8, a conventional approach 800 to data transfer from an unreliable network is provided. An input data 801 arrives to a controller 810. The controller 810 receives input data 801 to populate a buffer 811 which may be an SRAM buffer or the like. SRAM buffer 811 sequesters the input data 801 within the controller 810, thereby introducing a delay of the time it takes for the SRAM buffer to be populated with the input data 801. This is a first stage delay. A second stage delay is seen in error detection portion 812 which detects an error. A third delay portion is the regeneration portion 813 where errors are regenerated. Yet a fourth induced delay is a time for signaling and transfer of the regenerated portions back into the buffer 811. Thus, only once all four stages of delay have been completed may a transfer 814 from the SRAM buffer 811 to the destination memory 815 be commenced. And only thereafter is the full transfer of the entirety of the input data 801 initiated. Therefore, it is seen that no data arrives at all into the secondary or destination memory 815 until after all four stages of delay have been completed and a fifth stage, the transfer 814 in tow of the entire input data 801 has been initiated.

As seen in FIG. 8A, in contradistinction to the flow 800 seen in FIG. 8, an improved flow 800' is shown where input data 801 arrives which may have some predetermined level of inaccuracy, such as, for example an 80%-90% accuracy. Input data 801 arrives at a transfer controller 802 and immediately or at least without substantial delay passes through a pass-through section 804 to be delivered to a destination memory 808 without first awaiting buffer population, error detection, and error correction. At least a first portion of data, though not entirely reliable, begins to be available almost immediately in destination memory 808. Concurrent therewith, a splitting portion 803 allows a copy of the input data 801 to pass through to an error detection and/or correction module 806. The error detection and/or correction module 806 determines if there is an error and if not, immediately signals that no error exists. Otherwise a long process of error regeneration and correction is performed whereby portions with error are transmitted separately in a transmission 807 of just the delta, incremental, or corrected portions to arrive at the destination memory 808. Thereby, upon the relatively minor correction of the corrupt portions, the transfer of the input data 801 is complete. In the past, as seen in FIG. 8, once correction had been accomplished, only then could a complete transfer of 100% of the data be initiated; whereas, in the instant application, the input data 801 has already been transferred to the destination memory and only an incremental or corrected portion, generally equal to the likelihood of error in a transmitted or storage medium is then transferred.

To subsequently correct (or post-correct) the portions where error has been detected, a journaling module, chronicled, or journaled file system may record the location of the original input data 801 and where (what addresses) it was stored to in the destination memory 808. The journaling module is coupled to the correcting section or may be disposed separately and operationally coupled thereto, such as, for example, in the destination memory (or a controller thereof). Once error portions have been corrected, a look-up of the data may indicate where the corrected portions are to be written to in the destination memory 808. Further, the down stream processing steps performed on the input data 801 originally stored to the destination memory 808 may be evaluated based upon a log or journal of uses of the original data. Downstream processes that utilized the data may be evaluated to determine whether the data utilized in downstream calculations was erroneous and if such calculations need to be performed again based upon a plurality of predetermined factors such as the existence of error, the severity of error, the error resiliency of the downstream processing, the cost to correct the mistakes, and the like.

Figure 9:
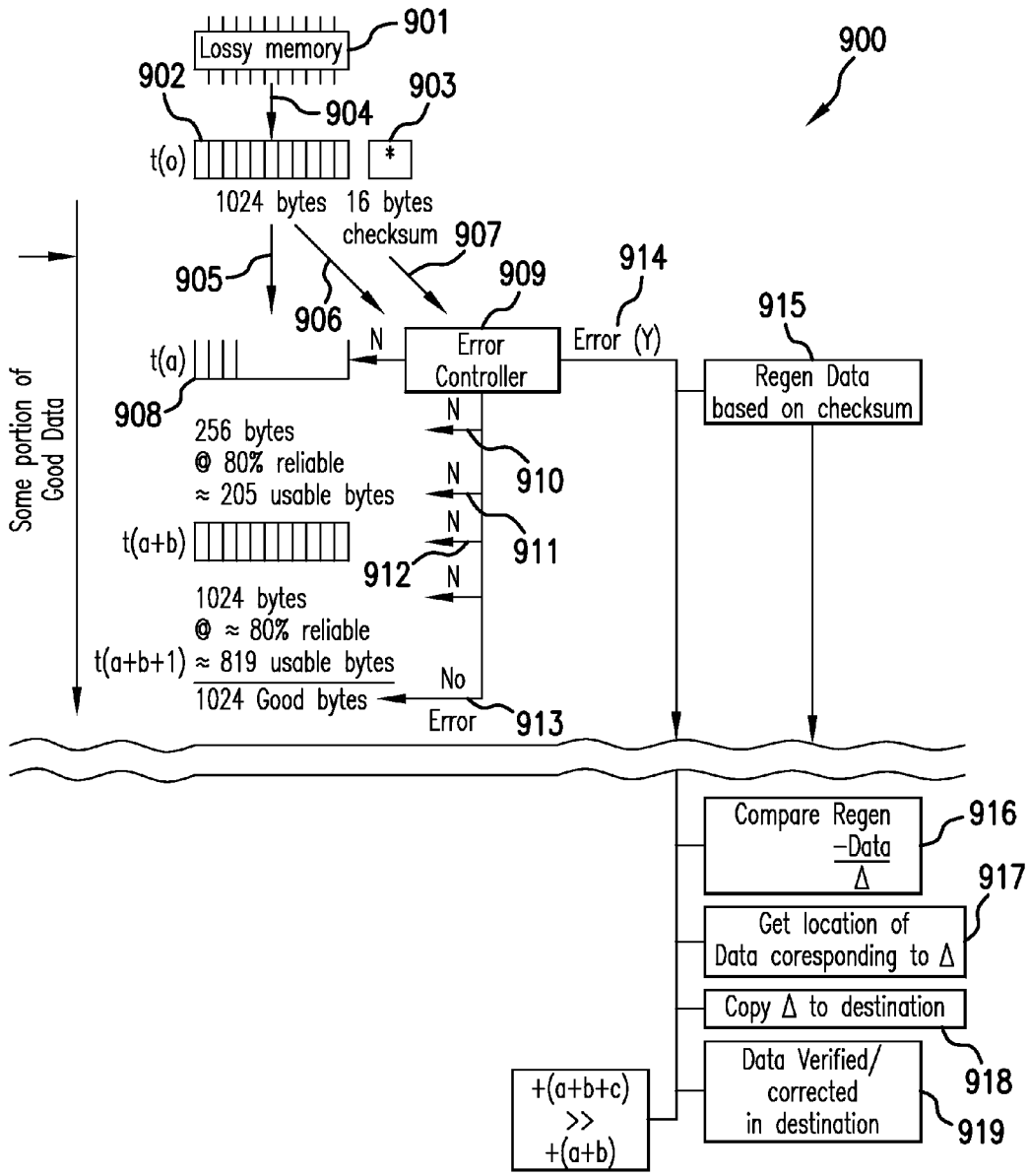
FIG. 9 is a yet more detailed flow diagram illustrating an exemplary embodiment of the present invention.

As seen in FIG. 9, a flow 900 for the expeditious transfer of data from source to destination in error corrected manner is shown. A retrieval operation 904 from a lossy source memory 901 (which may also be a lossy transfer medium such as an unshielded twisted pair, a coax cable or the like) is shown. A portion of data 902 is retrieved 904 from the lossy memory or medium 901. Additionally, a verification feature 903 is retrieved or received at time t(0). The input data 902 may comprise 1024 bytes, 512 bytes, or any portion generally used for transfers in the system. The verification feature 903 may be, for example, a 16 byte check sum of the input data 902.

Almost immediately after retrieval 904, at least a portion of the input data 902 is delivered 905 to a destination memory, medium, or host 908. Substantially concurrent with the transfer 905, a delivery 906 and 907 of the input data 902 and verification feature 903 respectively are delivered to an error controller 909. At a time t(a), a destination memory 908 contains at least some portion of the input data 902. This portion of data may be 4 bytes, 8, 16, 256 bytes, or the like, and may have some predetermined level of reliability such as 80-90% based upon an evaluation or a predetermined knowledge of the medium 901 retrieved from.

At time t(a), the destination memory 908 has some portion of the input data 902 with some predetermined level of reliability which, for example, may be 80% and thereby result in 205 usable statistically reliable bytes of the 256 exemplary byte portion in the destination memory 908. At time t(a), the error controller 909 may have already made a determination whether the input data 902 or at least a portion thereof such as the portion already stored in destination memory 908 contains an error and such determination may have already been signaled. Alternatively, the absence of a signal may conclude the transfer. The error controller 909 may alternatively make a rolling series of incremental error determinations if an incremental mode is preferred. At block 910, the error controller 909 may signal either the entirety of data input 902 or the portion in memory 908 is free of errors. If the error controller 909 is set for incremental determination of error, meaning that rather than determine a block 1024 in tow, rather the block may be subdivided into smaller portions and a series of error determinations 910, 911, 912, and/or 913 may commence periodically to advise the secondary or destination memory controller or the transfer controller that no error exists.

Thus, it is seen that almost immediately after time t(0) some portion of data having some predetermined reliability is transferred into destination memory 908 and becomes available for downstream processing. Additionally, at some time between time t(a) and t(a+b) more and more portions of data are arriving and more and more portions of data are being verified to be accurate. At time t(a+b) the full input data 902 has been stored in the destination memory 908. Therefore, generally, if the lossy memory 901 was 80% reliable, then of the 1024 bytes, approximately 819 are statistically usable and known to be good. At time t(a+b+1) if no error exists at all in the input data 902, then almost immediately the 1024 bytes are verified to be 100% accurate. Utilizing the incremental update and verification procedures such as 910-913, a greater and greater portion of the 1024 bytes is known to be accurate and reliable throughout the transfer thereof.

Conversely, if the error controller 909 does detect an error which may be almost immediately realized due to the check sum or ECC feature set, the error controller 909 may signal through an affirmative error detection signal 914 to a regeneration or error correcting portion which may attempt to regenerate the data at block 915. The regeneration may be based upon the input data 902 and the verification feature 903 which is a BCH ECC check sum data in a preferred embodiment.

As the regeneration of data is a very lengthy and processor intensive, expensive process, this may be performed in parallel with the actual delivery 905 of the input data 902 to the destination memory 908. Thereby, the regeneration of data at block 915 is performed substantially concurrent with downstream processes acting upon the good-enough data received in destination memory 908. Therefore, the downstream processing of the data in destination memory 908 is not in an extended wait-mode awaiting the regeneration of the data before any processing may begin such as in a pre-corrected approach.

Still further, a controller for the destination memory 908 or the special purpose transfer controller is not awaiting a signal indicating completion of regeneration and correctness determination before subsequent retrieval and writing actions for additional input data 902 retrieved from the lossy memory 901. Thus, a series of write operations of successive retrieved input data 902 may be performed on the destination memory 908 while continuing detection and correction queues are being performed within the error controller. Expanding an SRAM buffer or the like in the error controller allows multiple successive portions of retrieved input data 902 to be stored therein temporarily while being checked and corrected in the error correcting portion 915.

At block 916, having determined error and having corrected or regenerated the data, the regenerated data may be compared with the data temporarily stored in the buffer of the error controller 909 to thereby result in delta portions, or correction portions where there is a difference between the regenerated data and the original input data 902. At block 917, a process may be undertaken to determine the location in the secondary memory 908 of the input data 902 corresponding to the delta or correction portions. Such may be performed by comparison or look-up table that stored a recordation of the writes to the destination memory 908 of the dirty or partially unreliable data.

At block 918, the delta or correction portions are then copied or delivered to the destination memory 908. The delivery of these portions 918 may be roughly approximated to be the likelihood of error in the lossy memory or transmission medium 901 multiplied by the amount of total input data 902 which may be, for example, approximately 205 bytes relative to a 1024 byte initial input data 902 assuming a 20% loss rate of data in memory for storage medium 901. At block 919, the data has been verified, corrected, and sent into the destination memory 908. Now, it is seen that all 100% of the original input data 902 resides in the destination memory 908.

Optional down-stream error remediation steps may be taken based upon the downstream processing which relied upon the dirty or unverified data stored in the destination memory 908 while regeneration was occurring.

Thus, it can be seen that at least a portion of data arriving at t(a) offers a host of advantages over a wait until t(a+b+c) where c is much much greater than a and b (c>>a+b) and where c is the amount of time to complete steps 915-919.

Figures 10, 10A:
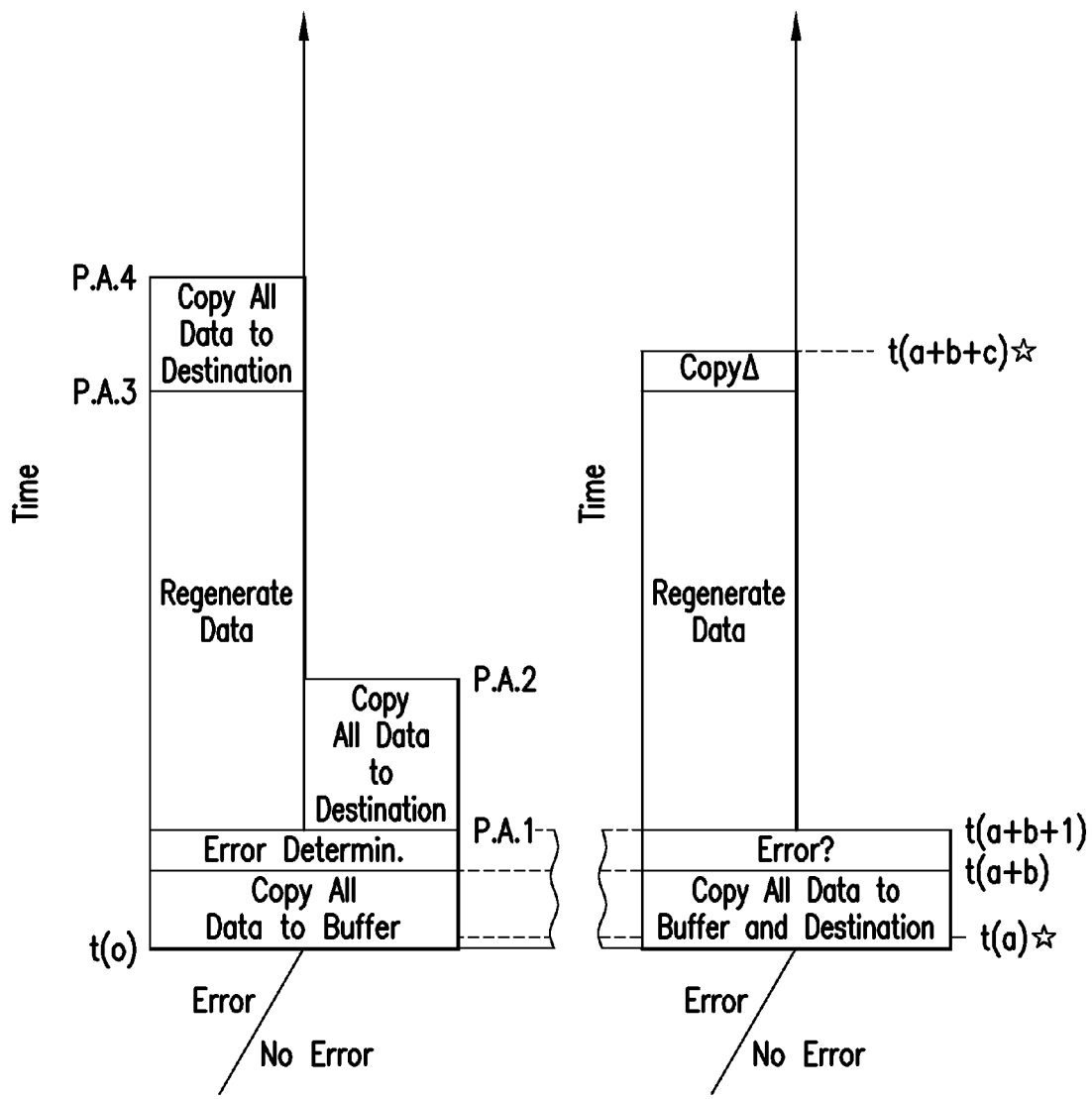
FIG. 10 is a timing chart illustrating a conventional approach timing.
FIG. 10A is a timing chart comparing an exemplary embodiment to the conventional approach timing.

FIGS. 10 and 10A show a comparison with a conventional time line in both a first example where error exists and a second example where error does not exist. In the conventional approach, data is stored into an SRAM buffer and then an error determination is performed. Where no error has been determined, then a copying of the entirety of the input data is initiated to a destination memory and thereby data becomes available at some time between $PA_1$ and $PA_2$.

Where there is error in the conventional approach, the delay of copying the data into the SRAM buffer, determining error, regenerating the data, and only then copying the data delays the delivery of the data to only become available at some time between $PA_3$ and $PA_4$.

Contrastingly, the subject system and method omits or defers the copying of data into an SRAM buffer and the error detection/remediation and instead almost immediately begins copying the totality of the input data to the destination memory. Thus, at time t(a), at least some portion of data becomes available in both cases where there is or is not error. At some time t(a+b), the data becomes verified. In other cases, it will become known that the data is 100% accurate or that it is likely accurate to the degree of the storage medium or transmission medium (e.g. 80%). At time t(a+b+1) it will either be determined that there is no error and 100% usable or that there is error. Opposingly, if there is error, a long regeneration process equal to the regeneration in the conventional approach is undertaken and then upon completion thereof, a copying of a smaller portion, the delta portion or corrected portions are initiated to the destination memory and thus, the data is 100% accurate and transferred at time t(a+b+c) which is available much sooner than any of the $PA_1$, $PA_2$, $PA_3$ or $PA_4$. Moreover, to continue the exemplary 80% reliability rate, roughly 80% of the time, it may be determined that no error exists and thus, 80% of the time, data is available at t(a) which is substantially before period $PA_1$ and $PA_3$.

Although this invention has been described in connection with specific forms and configurations thereof, it will be appreciated that various modifications other than those discussed above may be resorted to without departing from the spirit or scope of the invention. For example, equivalent elements may be substituted for those specifically shown and described, certain features may be used independently of other features, and in certain cases, particular combinations of circuit design and implementation of flow and processing steps may be reversed or interposed, all without departing from the spirit or scope of the invention as defined in the appended claims.

What is claimed is:

1. A method for expeditious transfer of data from source to destination in error corrected manner, comprising:
    establishing a destination memory;
    establishing a transfer controller to receive input data for delivery to said destination memory, the input data having a predetermined verification feature associated therewith;
    actuating said transfer controller to deliver the input data substantially as received to said destination memory;
    actuating said transfer controller to monitor the input data for error in portions thereof based on said predetermined verification feature, said transfer controller generating a corrected portion for each portion of the input data detected to contain error; and,
    delivering each said corrected portion to said destination memory to correct according to said corrected portion a corresponding portion of the input data previously delivered to said destination memory.

2. The method as recited in claim 1, wherein said monitoring the input data for error is performed concurrently with said delivery of the input data to said destination memory.

3. The method as recited in claim 1, further comprising identifying a location in said destination memory of each portion of the input data corresponding to each corrected portion and replacing each portion of the input data detected to contain error in the identified location with the corresponding corrected portion.

4. The method as recited in claim 3, further comprising actuating said transfer controller to concurrently write the input data into a data buffer while writing the input data into said destination memory.

5. The method as recited in claim 4, further comprising generating corrected portions based upon the input data and the verification feature wherein the verification feature includes an error correcting code (ECC).

6. The method as recited in claim 5, wherein the ECC includes a Bose Ray-Chaudhuri Hocquenghem (BCH) code of selectively set robustness according to said destination memory.

7. The method as recited in claim 6 further comprising writing the generated corrected portions into said data buffer, comparing the corrected portions with the input data to determine delta portions therebetween wherein the delta portions differ from the corrected portions, and transmitting the delta portions to said destination memory to replace therein each portion of the input data detected to contain error.

8. A system for expeditious transfer of data from source to destination in error corrected manner, comprising:
    a destination memory; and,
    a transfer controller coupled to said destination memory, said transfer controller receiving input data from a source for delivery to said destination memory, the input data having a predetermined verification feature associated therewith, said transfer controller including:
    a pass-through section directing the input data substantially as received to said destination memory; and,
    a correcting section coupled to said pass through section to monitor the input data for error in portions thereof based on said predetermined verification feature, said correcting section generating a corrected portion for each portion of the input data detected to contain error;
    wherein each said corrected portion is delivered to said destination memory to correct according to said corrected portion a corresponding portion of the input data previously delivered to said destination memory.

9. The system as recited in claim 8 wherein, said transfer controller is actuated to concurrently perform the delivery of the input data to said destination memory and monitor the input data for error in portions thereof.

10. The system as recited in claim 9, further comprising a journaling module coupled to said correcting section, said journaling module identifying a location within the input data in said destination memory for each corrected portion.

11. The system as recited in claim 10, further comprising a data buffer coupled to said transfer controller, the input data being concurrently written into said data buffer during delivery of the input data into said destination memory.

12. The system as recited in claim 11, wherein said pass-through section includes a Y connector duplicating the input data for respective delivery to said data buffer and said destination memory.

13. The system as recited in claim 12, wherein the transfer controller includes an ECC module executable to detect error in the input data and selectively generate corrected portions thereof.

14. The system as recited in claim 13 wherein the transfer controller includes a comparator module executable to compare the corrected portions in said data buffer with the input data to determine delta portions therebetween.

15. The system as recited in claim 14, wherein said ECC module is coupled to said destination memory, said ECC module transmitting the corrected portions to said destination memory to replace therein each portion of the input data detected to contain error.

16. A method for expeditious transfer of data from source to destination in error corrected manner, comprising:
    establishing a destination memory;
    establishing an error controller coupled to said destination memory; establishing a data duplication section to deliver input data substantially as received to said destination memory and deliver a duplicate version of the input data to said error controller;
    actuating said error controller to monitor the duplicate version for erroneous portions, said error controller generating a corrected portion for each portion of the duplicate version detected to contain error; and,
    delivering each corrected portion to said destination memory to correct according to said corrected portion a corresponding portion of the input data previously delivered to said destination memory from said data duplication section.

17. The method as recited in claim 16, further comprising:
    establishing a data buffer to receive the duplicate version;
    actuating said error controller to generate correction information responsive to detection of an erroneous portion in the duplicate version in said data buffer; and, applying the correction information to the erroneous portion from said data buffer to generate the corrected portion.

18. The method as recited in claim 16, further comprising: the input data delivered to said destination memory being made accessible for extraneous processing during generation of the corrected portion.

19. The method as recited in claim 18, further comprising journaling which portions of the input data are accessed by the extraneous processing to enable subsequent selective reprocessing according to the corrected portion.

20. The method as recited in claim 16, wherein said monitoring of the duplicate version is initiated during delivery of the input data to said destination memory.

* * * * *